United States Patent [19]

Higano et al.

[11] Patent Number: 5,001,655

[45] Date of Patent: Mar. 19, 1991

[54] DEVICE FOR INSPECTING A PRINTER

[75] Inventors: Ryo Higano; Yasunori Matsui; Kenichi Tsumuraya, all of Tokyo, Japan

[73] Assignee: Seikosha Co., Ltd., Tokyo, Japan

[21] Appl. No.: 322,833

[22] Filed: Mar. 13, 1989

[30] Foreign Application Priority Data

Mar. 18, 1988 [JP] Japan ................................ 63-64862

[51] Int. Cl.[5] ............................................ G01R 31/14

[52] U.S. Cl. .............................. 364/551.01; 364/519; 324/511; 371/15.1; 101/414

[58] Field of Search .................. 364/519, 550, 551.01; 371/15.1, 16.1; 101/484, 494; 400/3, 8, 16, 17, 68; 324/508, 511, 537, 66

[56] References Cited

U.S. PATENT DOCUMENTS 2,858,507 10/1958 Liautaud et al. .............. 324/511 X
4,055,801 10/1977 Pike et al. ...................... 364/550 X
4,164,701 8/1979 Gulledge et al. .................. 324/508
4,179,732 12/1979 Khan et al. ......................... 364/200
4,282,583 8/1981 Khan et al. ......................... 364/900
4,290,138 9/1981 Bare et al. ...................... 371/15.1 X
4,464,722 8/1984 Von Osten ..................... 364/551.01
4,754,428 6/1988 Schultz et al. ................. 364/519 X
4,794,599 12/1988 Purcell et al. ...................... 371/21.2
4,810,958 3/1989 Mogi et al. ................... 371/15.1 X

*Primary Examiner*—Joseph L. Dixon
*Attorney, Agent, or Firm*—Jordan and Hamburg

[57] ABSTRACT

A device for inspecting a printer includes a plurality of interface circuits for a plurality of different kinds of printers. Connectors connect each of the interface circuits to a respective printer. A storage arrangement stores test printing data. A control circuit is connected to select one of the interface circuits and to transmit the test printing data from the storage arrangement to the respective printer for controlling the respective printer to print the test printing data.

4 Claims, 5 Drawing Sheets

DEVICE FOR INSPECTING A PRINTER

BACKGROUND OF THE INVENTION

The present invention is directed to a device for inspecting a printer.

In locations at which printers are produced and put on sale and service or system maintenance are provided, the daily operations involve the testing or demonstration of the printers.

Personal computers have heretofore been employed for such tests or demonstrations. In such testing and demonstrations, printing data dedicated to perform the tests are stored in floppy disks and are subsequently transmitted to the printer to effect the printing test.

The above-described arrangement requires a large-sized and expensive personal computer and is disadvantageous in terms of portability. This results in inefficient testing performance. In connection with sales of printers, it is inconvenient to perform the demonstrations at the shops or present the printers in a show.

Accordingly, it is a primary object of the present invention to provide a device for inspecting a printer, which is capable of decreasing both its weight and size, providing good portability and facilitating the inspection thereof.

SUMMARY OF THE INVENTION

In accordance with the present invention, interface circuits are provided corresponding to a plurality of different kinds of specific printers, as well as connectors for connecting the individual interface circuits to the corresponding printers. Printing data for tests are stored in a storage means. Subsequently, the printing data are transmitted from the storage means via the interface circuits and the connectors to the printers at the location at which the test printing is to be effected.

Connectors preferably connectable to a remote control switch are also provided.

In addition interface circuits for selectively transmitting and receiving the printing data are provided as well as connectors for connecting these interface circuits to other inspecting devices, whereby simultaneous inspections can be carried out by a plurality of inspecting devices.

Figure 1:
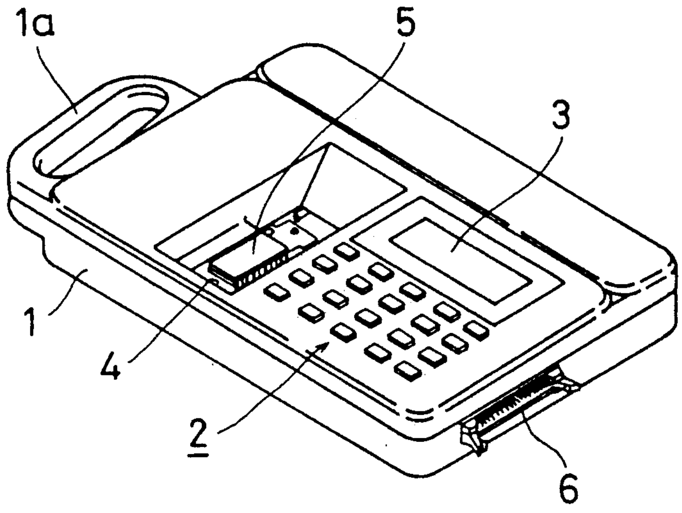
FIG. 1 is a perspective view illustrating one embodiment of the present invention.
Figure 2:
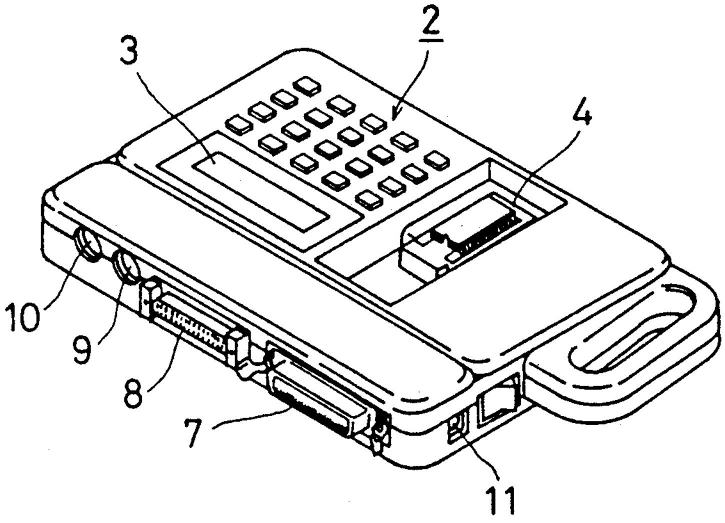
FIG. 2 is a perspective view depicting the device of FIG. 1 at a different angle.

DESCRIPTION OF THE PREFERRED EMBODIMENTS:

Referring first to FIGS. 1 and 2, a frame body 1 is formed integrally with a handle 1*a* for carrying the device itself with one hand. The front surface of frame body 1 is provided with a key board 2 for selecting a printer to be inspected and setting a variety of modes and a liquid crystal display unit 3 for displaying the operating modes and time. Key board 2 includes numeric value keys 0 through 9, keys A through F and command keys [RST], [JOB], [RPT] and [SET]. Numeral 4 designates a ROM socket in which a storage means 5 consisting of a ROM for storing the printing data used for the tests is detachably mounted. Numeral 6 denotes second and third connectors for connecting a remote control switch (not illustrated) to the present inspecting device or for connecting the device to other similar inspecting devices in order to simultaneously employ a plurality of inspecting devices. Numerals 7 to 10 indicate first connectors for connecting four kinds of specific printers A to D. In this embodiment, the inspections of these four kinds of printers may be effected. Numeral 11 designates an AC adaptor jack for charging a built-in Ni-Cad battery (not shown) with electricity to provide an internal power source.

Figure 3:
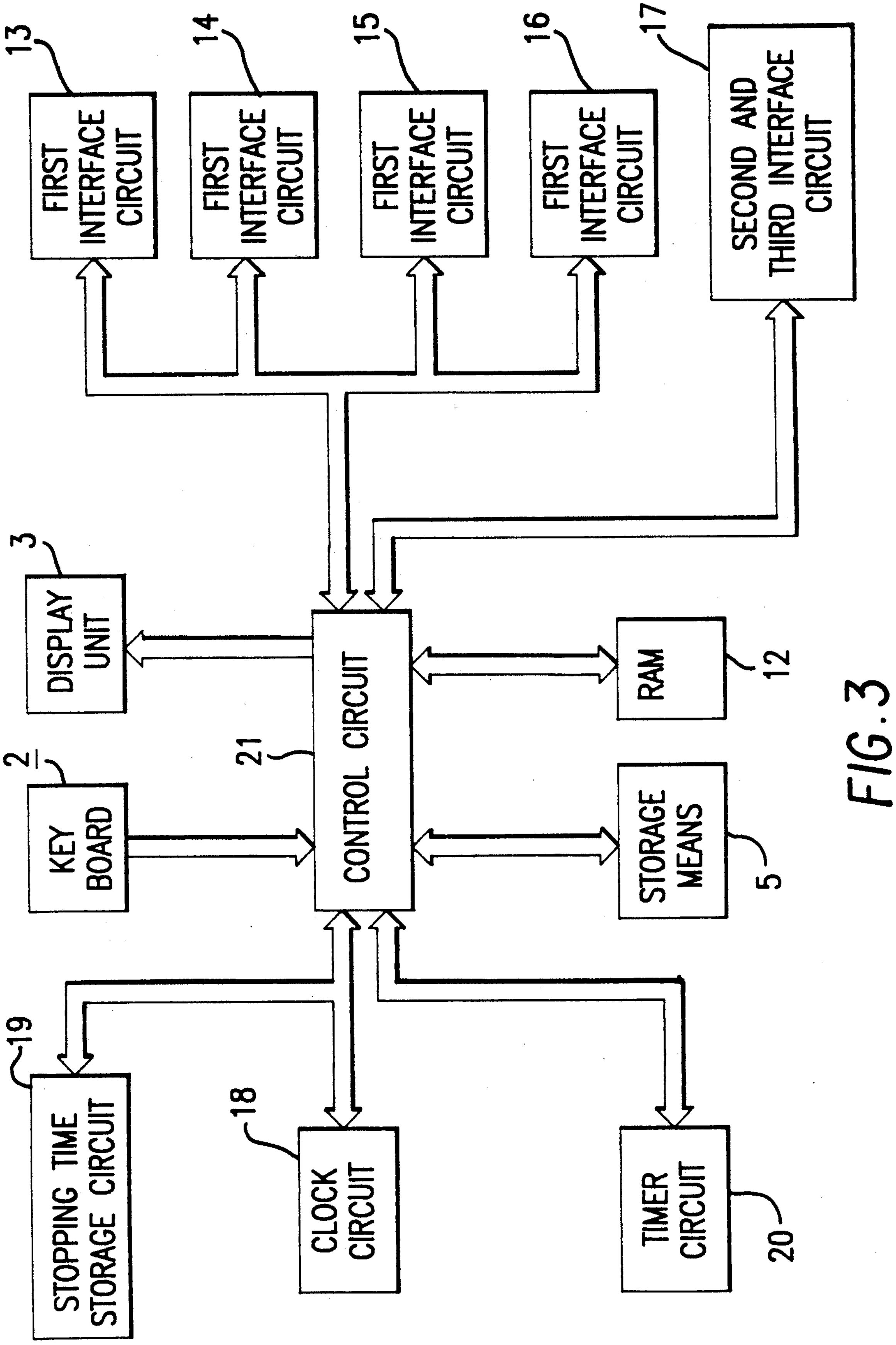
FIG. 3 is a block diagram showing one example of a circuit of the invention.

Referring now to the circuit illustrated in FIG. 3, a RAM 12 is capable of receiving arbitrary test printing data by use of key board 2. Numerals 13 to 16 denote first interface circuits, connected to connectors 7 through 10, for use with the printers. The first interface circuits serve to convert the test printing data into signals suited to the printers and then to transmit the thus converted signals to the respective printers. Numeral 17 represents second and third interface circuits, connected to connectors 6, for transmitting and receiving the test printing data. Circuits 17 also receive printing start and stop signals from the remote control switch. Numeral 18 represents a clock circuit; 19 a stopping time storage circuit for storing a print stopping time when an error is caused or the supply of printing paper ceases; 20 a timer circuit for setting the permissible time from transmission of the printing data to the response of the printer; and 21 a control circuit comprised of a CPU for controlling the individual circuits.

Figure 4:
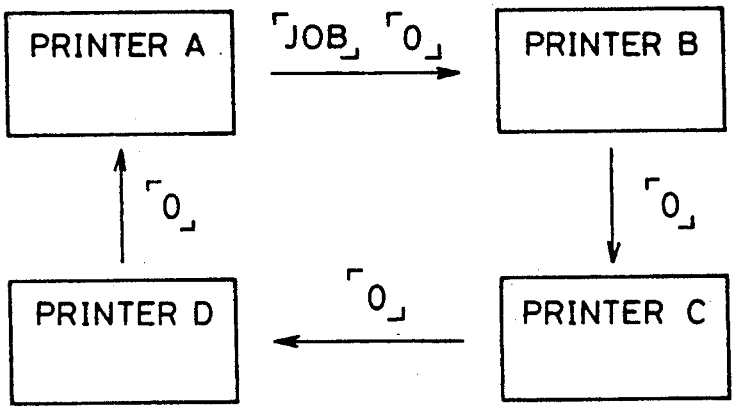
FIGS. 4 and 5 are diagrams explaining the operation of the device.

The operation of the device will now be described. The operation starts by selecting the printer to be inspected. Subsequent to depression of the [JOB] key during standby, or after turning the power supply ON, interface circuits 13 to 16 are sequentially selected every time the [0] key is depressed. In conformity with this selection, as shown in FIG. 4, the indication on display unit 3 is cyclically changed. When the identification of the printer to be inspected is displayed, the [SET] key is pushed down, thereby selecting the first interface circuit corresponding to that printer.

Figure 5:
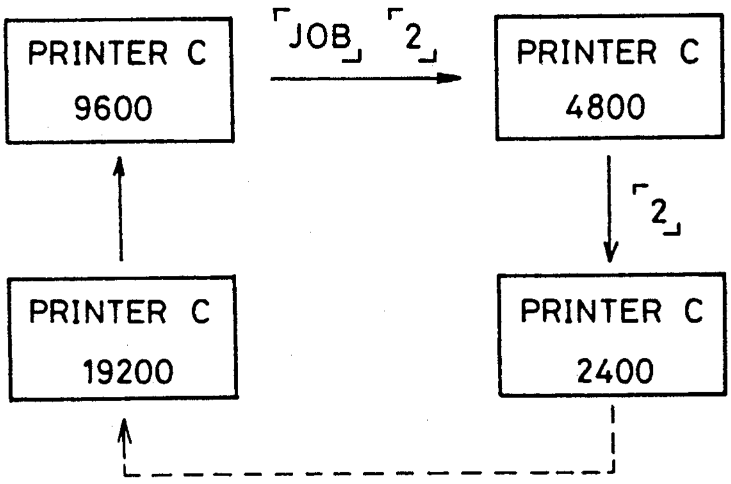

The next step is to set the parameters of the thus selected interface circuit. When, e.g., a serial type of printer is selected its baud rate, data format or the like are set. When setting the baud rate, every time the [2] key is depressed after pushing down the [JOB] key, baud rates [9600], [4800], . . . are sequentially selected and then cyclically displayed, as illustrated in FIG. 5, on display unit 3. When a desired baud rate is displayed, the [SET] key is depressed at which time this baud rate is set.

The proper setting is effected by operating the corresponding keys with respect to other data.

After the setting has been completed in the above-mentioned manner, the printing data of storage means 5 can be read out by pushing the [SET] key down. Subsequently, the printing data are transmitted from the previously-selected first interface circuit in a manner compatible with the printer, and the test printing is thereby performed.

In accordance with this embodiment, built-in timer circuit 20 is capable of setting the time of the timer by operating the appropriate key. The time to be set in the timer is the permissible time from the outputting of printing data to the response from the printer. If no response is received for more than this setting time, an error will be displayed on display unit 3.

If signals indicating paper empty, error stop and so on are sent from the printer during the printing, the exact time should be stored in the stopping time storage circuit 19 and displayed on display unit 3, whereby the stopping time can be confirmed.

The remote control function will now be described. Referring to FIG. 1, connectors 6 are arranged to be connectable to the remote control switch. With this arrangement, the printing can be started and stopped by manipulating the remote control switch. The signal from the remote control switch is received via interface circuit 17 shown in FIG. 3. The signal is then input as a start or stop signal to control circuit 21. Therefore, the arrangement is quite simple wherein a separately manufactured switch box is connected via a cable to connectors 6. As a result, it is feasible to control the printing from a location far from the printer. This feature facilitates inspection, especially on a production line.

The above description has dealt with the case in which the fixed printing data stored in storage means 5 are printed. In accordance with a further embodiment, however, the user can arbitrarily set the test printing data by using RAM 12 . The setting of printing data in RAM 12 and of the number of repetitions of printing is executed by operating the proper keys simultaneously when specifying an address and setting the data. When performing the printing on the basis of the printing data set in RAM 12, the readout of the printing data from storage means 5 is prohibited by pushing down the [C] key after depressing, e.g., the [JOB] key, with the result that a change-over is effected to perform the printing based on the data received from RAM 12. The change-over of printing data to storage means 5 involves the step of depressing the [C] key after depressing the [JOB] key once again.

Figure 6:
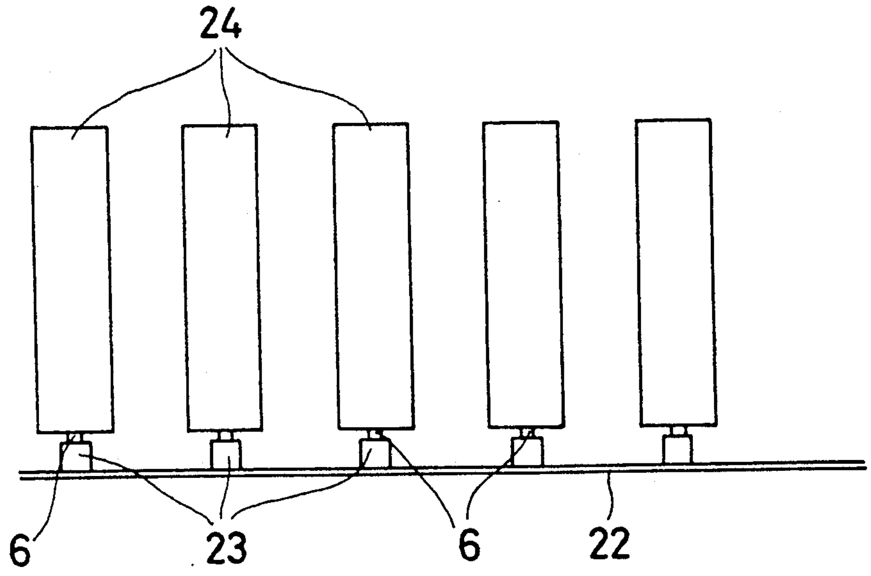
FIG. 6 is a front elevation showing the interconnection of a plurality of inspecting devices.

The description will now be directed to the simultaneous inspection of a plurality of printers by simultaneously transmitting the same printing data from a plurality of inspecting devices interconnected via connectors by means of a cable. In such a case, as illustrated in FIG. 6, a plurality of connector units 23 are disposed along a piece of flat cable 22, and the connectors 6 of the inspecting devices 24, each having the above-described construction, are respectively connected thereto. The master function is assigned to one of these inspecting devices, and the others may be denoted as slaves. The slave devices are simultaneously driven in accordance with the printing data sent from the master device, thereby executing the inspections of the printers connected to the slave inspecting devices at the same time.

Figure 7:
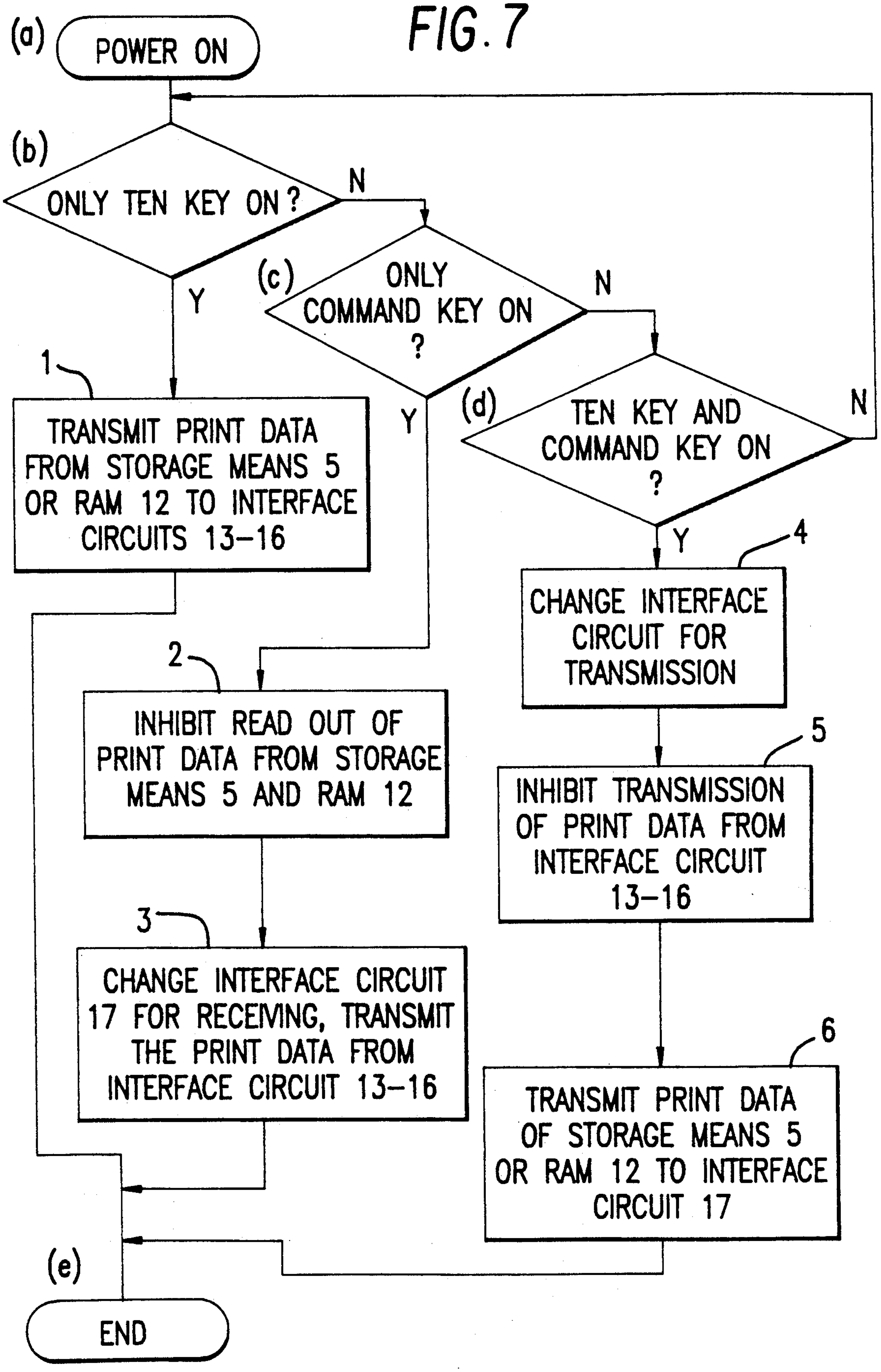
FIG. 7 is a flowchart explaining the operation of the invention.

In this case, it is necessary that the inspecting devices be forced to function as the master or slaves at the time of initialization. The setting process will now be described in conjunction with the flowchart of FIG. 7. When the inspecting device of the present invention is, as explained earlier, used as a single unit, the process begins with turning on the power supply while depressing any one of the numeric keys. As a result, interface circuit 17 shown in FIG. 3 does not function, and the printing data of storage 5 or RAM 12 are transmitted from any one of interface circuits 13 through 16 to the printer (step (1) in FIG. 7), thereby performing the printing.

In order to employ the inspecting devices as the slaves, the power supply is first turned on while depressing any one of the command keys, as a result of which the readout of data from storage means 5 as well as from RAM 12 is prohibited (step (2)). Subsequently, interface circuit 17 is changed over to receive external data, and the thus received printing data are in turn transmitted from any one of interface circuits 13 through 16 (step (3)), the devices thus functioning as slaves.

When the inspecting device is to be set to behave as the master, the power supply is turned on, while any of the numeric keys and of the command keys are simultaneously depressed. Consequently, interface circuit 17 is changed over to transmit the data (step (4)), and the data transmission from interface circuits 13 through 16 is prohibited (step (5)). Then, the printing data from storage means 5 or RAM 12 are sent from interface circuit 17. The printing data are received by the slave inspecting devices connected to cable 22 of FIG. 6. The slave inspecting devices supply the printing data via any one of interface circuits 13 through 16 to the printers, at which locations the inspections are carried out.

In the above-mentioned embodiment the storage means uses a ROM. Alternatively, if a floppy disk is employed, a remarkable increase in the capacity of the printing data can be obtained.

When test printing, the date and time at which the test printing has been effected can be printed by transmitting an output of clock circuit 18 as an item of printing data.

According to the present invention, the interface circuits and the connectors that are provided correspond to a plurality of kinds of specific printers. The interface circuits are selected in accordance with the printers to be inspected, and the test printing is performed by transmitting the printing data of the storage means. The devices dedicated to the inspections for the printers can be fabricated with decreases both in configuration and in weight so that the device is readily portable. It is therefore possible to perform inspections on the production line and demonstrations at the shops or presenting the devices in a show. Hence, excellent results are achieved in terms of production, sales, maintenance and services.

The connectors that are connectable to the remote control switch permit the control from a location far from the printers to provide convenience in the tests on the production line.

In addition, it is feasible to simultaneously inspect a plurality of printers by an arrangement in which the interface circuits for selectively transmitting and receiving the printing data are connected to other inspecting devices serving as slave devices, and these slave devices are simultaneously driven on the basis of the printing data from the master inspecting device. As a result, labor required for the inspections on the production line can be saved.

We claim:

1. A device for inspecting a printer, comprising:

a plurality of first connectors each of which is adapted to be connected to a printer, each said first connector corresponding to a different kind of printer;

a plurality of first interface circuits each of which is coupled to a respective one of said first connectors;

a storage means for storing test printing data; and a control circuit connected to selectively enable said first interface circuits to transmit said test printing data from said storage means to the respective first connector for controlling a printer coupled thereto to print said test printing data.

2. The device of claim 1, further comprising:

a second connector connectable to a remote control switch;

and a second interface circuit for transmitting signals from said second connector to said control circuit, said control circuit comprising means for permitting the control of printing by signals received at said second connector.

3. The device of claim 2, further comprising:

a third interface circuit for selectively transmitting and receiving test printing data; and said second connector being connected to receive printing data from said third interface circuit and to supply printing data from an external device to said third interface circuit, said control circuit comprising means for sending printing data received by said third interface circuit via said second connector to said first connectors.

4. A printing data transmitting device for transmitting printing data to printers for test purposes, said device comprising a plurality of connectors each of which is adapted to be connected to a respective one of a corresponding plurality of different kinds of printers;

a corresponding plurality of interface circuits each of which is connected to a respective connector and each of which is for use with the respective printer;

storage means for storing printing data employed for test printing;

and a control circuit connected to said storage means, for selecting a desired one of the interface circuits and arranged to transmit thereto said printing data from said storage means for applying said printing data to the respective printer.

* * * * *